United States Patent
DiPoala

(10) Patent No.: US 7,009,106 B2
(45) Date of Patent: Mar. 7, 2006

(54) SHIELDING ASSEMBLY AND METHOD

(75) Inventor: William S. DiPoala, Fairport, NY (US)

(73) Assignee: Bosch Security Systems, Inc., Fairport, NY (US)

( * ) Notice: Subject to any disclaimer, the term of this patent is extended or adjusted under 35 U.S.C. 154(b) by 203 days.

(21) Appl. No.: 10/682,651

(22) Filed: Oct. 9, 2003

(65) Prior Publication Data

US 2005/0078468 A1    Apr. 14, 2005

(51) Int. Cl.
H05K 9/00    (2006.01)
(52) U.S. Cl. .............................. 174/35 MS; 174/35 R; 361/816; 361/800
(58) Field of Classification Search .............. 174/35 R, 174/35 MS, 35 GC; 361/816, 818, 800
See application file for complete search history.

(56) References Cited

U.S. PATENT DOCUMENTS

| | | | |
|---|---|---|---|
| 4,455,448 A | 6/1984 | Bertolina | |
| 4,466,912 A | 8/1984 | Phillips et al. | |
| 4,660,024 A | 4/1987 | McMaster | |
| 4,731,611 A | 3/1988 | Muller et al. | |
| 5,077,548 A | 12/1991 | Dipoala | |
| 5,150,282 A | 9/1992 | Tomura et al. | |
| 5,208,567 A | 5/1993 | Bell et al. | |
| 5,262,783 A | 11/1993 | Philpott et al. | |
| 5,371,404 A | 12/1994 | Juskey et al. | |
| 5,450,062 A | 9/1995 | DiPoala | |
| 5,486,720 A | 1/1996 | Kierse | |
| 5,557,064 A | 9/1996 | Isern-Flecha et al. | |
| 5,639,989 A * | 6/1997 | Higgins, III | 17/35 MS |
| 5,763,824 A * | 6/1998 | King et al. | 174/35 R |
| 5,847,938 A * | 12/1998 | Gammon | 361/816 |
| 5,876,643 A | 3/1999 | Biggs et al. | |
| 6,147,301 A | 11/2000 | Bhatia | |
| 6,212,073 B1 * | 4/2001 | Yamaguchi | 361/705 |
| 6,219,253 B1 | 4/2001 | Green | |
| 6,275,390 B1 | 8/2001 | Wu et al. | |
| 6,377,473 B1 | 4/2002 | Huang et al. | |

OTHER PUBLICATIONS

Dual Tec DT-900 Series, DUAL Technology Motion Sensor K-Band Technology, Product Brochure 5-053-144-00 Rev C (2001).
Fiber SenSys, Inc. DT-700 Dual Technology Intrusion Detection, Product Brochure, unknown date.
Wolf Manufacturing, Inc.—Advanced RF/EMI Shielding Solutions production information from website www.wolf.mfg.com (2000).

(Continued)

Primary Examiner—Hung V. Ngo
(74) Attorney, Agent, or Firm—Baker & Daniels LLP

(57) ABSTRACT

A shielding assembly and method for use with an electromagnetic field generating source. The assembly includes an outer housing that includes a conductive material. The outer housing defines a chamber in which the field generating source is located. A polymeric inner body substantially fills the chamber. The inner body is spaced from and circumscribes the field generating source. The field generating source may be the resonant oscillator of a microwave transceiver circuit and the inner body may advantageously include between 2–10%, by weight, of a semiconductive filler such as carbon or graphite. A printed circuit board may be attached to the outer housing to define the chamber together with the outer housing. The inner body may be secured within the chamber by compressive engagement between the printed circuit board and outer housing. Spacing elements are used to provide a clearance gap between the printed circuit board and the inner body.

39 Claims, 6 Drawing Sheets

OTHER PUBLICATIONS

Quesnel, Norman, "Optimizing EMI Shielding for Wireless System", unknown date.

W.L. Gore & Associates, Inc.—Preliminary Data Sheet Gore-Shield snapSHOT Board-Level EMI Shield, Product Brochure, (2003).

Noordegraaf, Jan and Hull, Harry, "C-SHIELD Parylene allows major weight saving for EM shielding of microelectronics", The First IEEE International Symposium on Polymeric Packaging, pp. 190-196 (1997).

See-Through Conductive Fabric, website production information www.lessemf.com, unknown date.

Haj-Daoud, A.N., Zihlif, A.M., and Abdelazeez, M.K., "Optimum measuring conditions of shielding effectiveness for conductive polymer composite", Materials Letters 15 (1992) 104-107 North-Holland.

Abdelazeez, Mohamed K.; Baker, Zafer Q.O.; Zihlif, Awwad M., "Shielding Effectiveness of the Magnex DC Composite", IEEE 1988 International Symposium on Electromagnetic Compatibility, (1988), pp. 231-234.

* cited by examiner

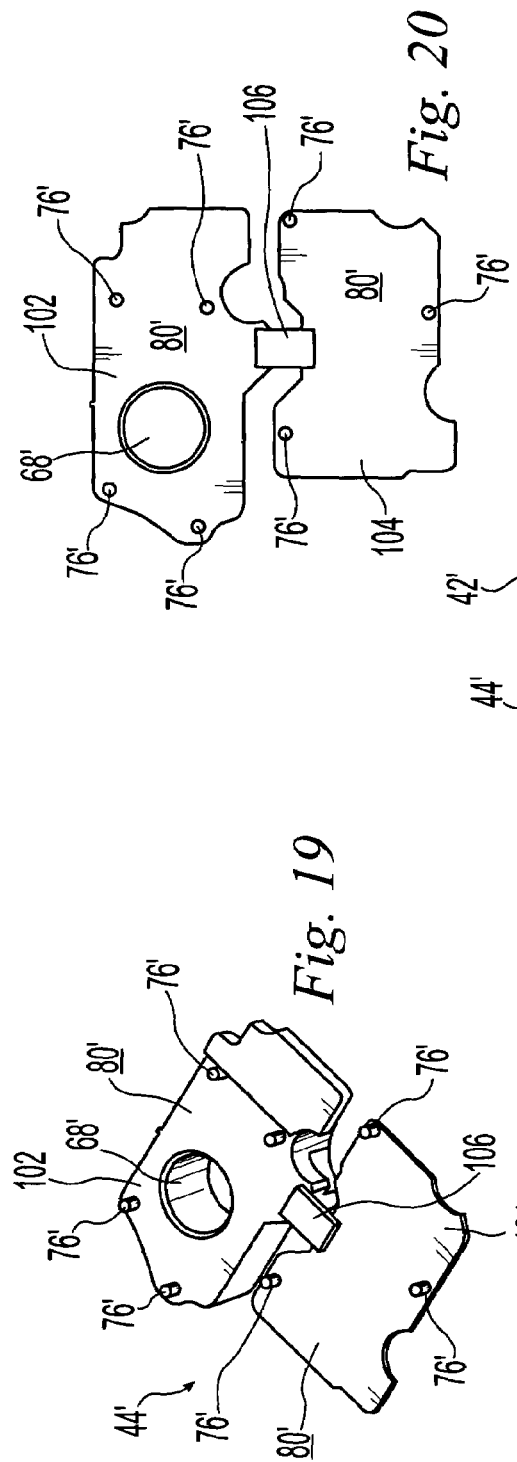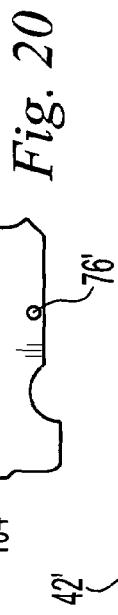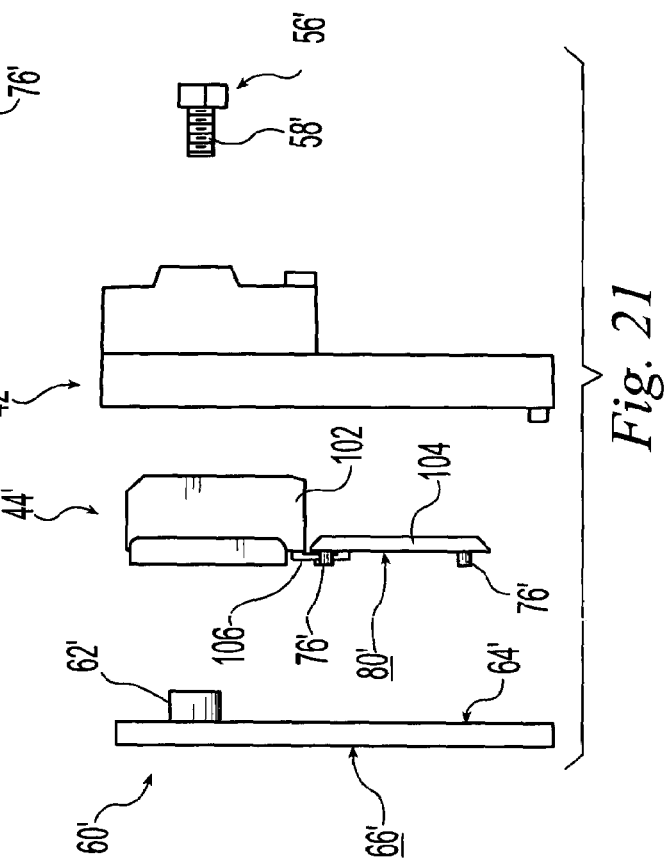

SHIELDING ASSEMBLY AND METHOD

BACKGROUND OF THE INVENTION

1. Field of the Invention

The present invention relates to shielding assemblies and, more particularly, an improved shielding assembly that can be used with an intrusion detection system employing microwave radar.

2. Description of the Related Art

A variety of devices generate electrical and magnetic fields that may require shielding to prevent undesired emissions. One example of such a device are intrusion detection systems that employ microwave radar. Such systems generate microwave pulses at a predetermined frequency to detect objects and the motion of such objects. Microwave radar systems also typically generate unwanted radio frequency (RF) emissions at other frequencies. Intrusion detection systems employing microwave radar are generally subject to governmental regulations, e.g., by the FCC in the U.S. and by the CE in the European Union, that place limits on such unwanted RF emissions.

To attenuate the unwanted RF emissions, it is known to use a metallic box-like enclosure to enclose the electronic circuitry generating the unwanted RF emissions or to place the entire circuit inside a sealed metallic enclosure. Conducting elements entering and exiting the enclosure may also be filtered to reduce RF emissions. Although such metallic enclosures perform well in preventing the external emission of the unwanted RF energy, the metallic enclosures typically reflect, instead of absorb, much of the RF energy. The reflected RF energy can disrupt the circuits contained within the enclosure, generate noise within the system, and interfere with the filtering of the conducting elements entering and exiting the enclosure. It is also known to add foam or rubber sheets containing ferrite, carbon or metal powders to the interior of the enclosure walls to absorb some of the RF energy. These sheet materials, which may have military applications and be regulated by the government, are typically quite expensive. Consequently, a need exists for an alternative shielding assembly.

SUMMARY OF THE INVENTION

The present invention provides a shielding assembly for an apparatus having a RF emission generating source, e.g., a microwave radar motion detection system, that employs an outer housing that inhibits the emission of RF energy through the housing and an internal body for absorbing RF energy that substantially fills the open volume within the housing chamber containing the source of the RF emissions.

The invention comprises, in one form thereof, a shielding assembly for use with an electromagnetic field generating source. The assembly includes an outer housing comprising a conducting material wherein the outer housing defines a chamber enclosing the source and also defines a housing wall thickness. An inner body having a non-planar configuration substantially fills the chamber, i.e., it fills at least about 50% of the void volume within the chamber, and defines a thickness greater than the housing wall thickness. The inner body is formed of a composition comprising a polymeric material and a filler material comprising one of the group consisting of a semiconductive material and a dispersed conductive material. As used herein, a dispersed conductive material refers to a conductive material that is sufficiently dispersed within another material or substance such that the mass of dispersed conductive material does not form, as a whole, a unitary conductive element. Advantageously, the inner body may fill at least about 80% of the void volume of the chamber.

The polymeric material used to form the inner body may be ABS or nylon and the semiconductive material may be carbon or graphite. The filler material may advantageously be between 2 to 10%, by weight, of the inner body. The outer housing may be a solid metallic material or a polymeric material with metallic fibers, e.g., an ABS plastic with stainless steel fibers.

The invention comprises, in another form thereof, a shielded microwave transceiver assembly that includes a microwave transceiver circuit including a resonant oscillator coupled with a printed circuit board. The printed circuit board has a first major surface and an opposite second major surface and the resonant oscillator defines an oscillator projection extending outwardly from the first major surface. An outer housing comprising a conducting material is positioned in engagement with the first major surface wherein the outer housing and the first major surface define an area of contact circumscribing the oscillator projection. The outer housing and the first major surface define a first chamber enclosing the oscillator projection. An inner body comprising a polymeric material substantially fills the first chamber wherein the inner body is spaced from and substantially circumscribes the oscillator projection. The inner body may also include a semiconductive or dispersed conductive material within the approximate range of 2–10% by weight.

Some embodiments of the inner body include a first surface disposed substantially parallel to and facing the printed circuit board and at least one spacing element engaged with the printed circuit board to position the first surface at a predetermined distance, e.g., 0.05 inches (0.127 cm), from the printed circuit board wherein the first surface forms a substantial majority of the inner body facing the printed circuit board.

The printed circuit board may advantageously include a grounding layer and a plurality of grounding vias comprising plated through holes electrically connecting traces on the first major surface to the grounding layer wherein the plurality of grounding vias define a plurality of staggered rows substantially circumscribing the first chamber.

The outer housing and printed circuit board may also define a second chamber wherein the printed circuit board has a first portion disposed facing the first chamber and a second portion facing the second chamber, the area of contact between the outer housing and first major surface separately circumscribing each of the first and second chambers and substantially separating the first and second chambers. The printed circuit board includes a grounding layer and a plurality of grounding vias comprising plated through holes electrically connecting traces on the first major surface to the grounding layer, the plurality of grounding vias substantially circumscribing each of the first and second chambers. Such an assembly may be configured wherein the microwave transceiver circuit defined by the first portion of the printed circuit board generates a radio frequency signal and the printed circuit board further includes a conductive material defining a signal path communicating the signal from the first portion to the second portion of the printed circuit board with the signal path including a first microstrip second harmonic filter disposed between the first and second portions. The signal path may extend through the second portion of the printed circuit board and communicate the signal from the second portion to a transmitting antenna wherein the signal path includes a second microstrip second harmonic filter in the second portion of the printed circuit board.

The invention comprises, in yet another form thereof, a method of shielding a motion detection system having a resonant oscillator defining a projection extending from a printed circuit board. The method includes engaging the printed circuit board with an outer housing wherein the outer housing and printed circuit board define a first chamber, the oscillator projection being disposed within the first chamber and the outer housing comprising a conductive material. The method also includes positioning a polymeric inner body in the first chamber wherein the inner body substantially fills the first chamber, said inner body spaced from and substantially circumscribing the oscillator projection.

The method may involve positioning the polymeric inner body in the first chamber prior to engaging the printed circuit board with the outer housing and further including the step of securing the inner body within the first chamber by securing the printed circuit board to the outer housing and thereby compressively engaging the inner body between the outer housing and the printed circuit board. The inner body may also include a substantially planar first surface disposed parallel to and facing the printed circuit board, the first surface comprising a substantial majority of the inner body facing the printed circuit board wherein the method further includes maintaining a predetermined distance between the first surface of the inner body and the printed circuit board by positioning at least one spacing element, that may be integrally formed with the inner body, between the first surface and the printed circuit board.

An advantage of the present invention is that it provides a cost effective and easily manufactured shielding assembly that can be used with an intrusion detection system employing microwave radar to limit the unwanted RF emissions to the levels required by regulating governmental bodies.

BRIEF DESCRIPTION OF THE DRAWINGS

The above mentioned and other features and objects of this invention, and the manner of attaining them, will become more apparent and the invention itself will be better understood by reference to the following description of an embodiment of the invention taken in conjunction with the accompanying drawings, wherein:

FIG. 19 is a perspective view of the inner shielding body of the second embodiment.

FIG. 20 is front view of the inner shielding body of FIG. 19.

FIG. 21 is an exploded side view of the second embodiment.

Figure 1:
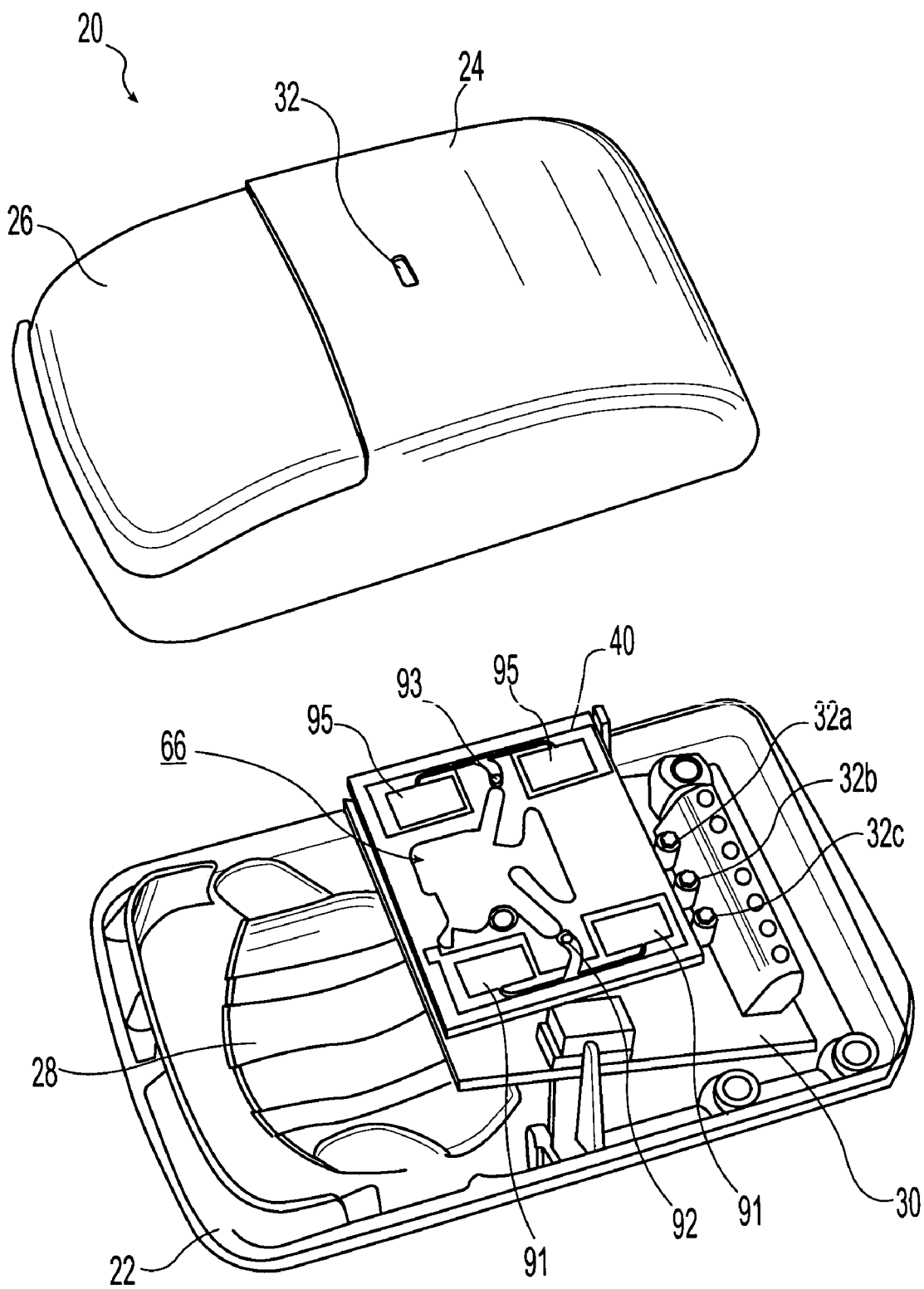
FIG. 1 is a view of an intrusion detection system incorporating the present invention.
Figure 2:
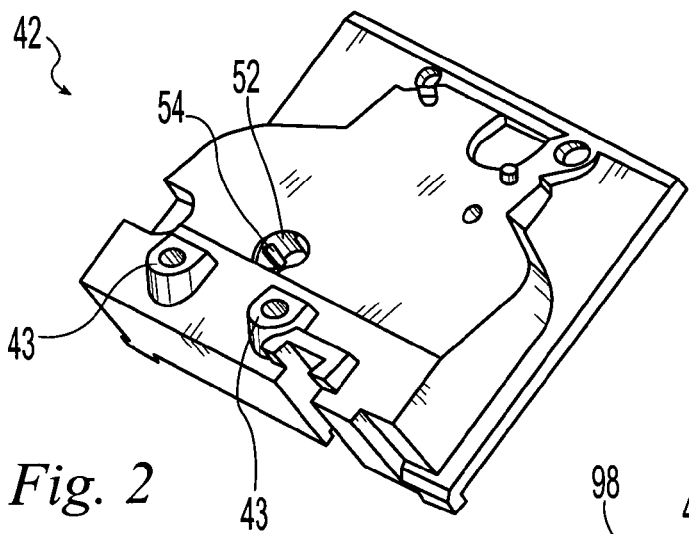
FIG. 2 is a perspective view of an outer shielding body in accordance with a first embodiment of the invention.
Figure 3:
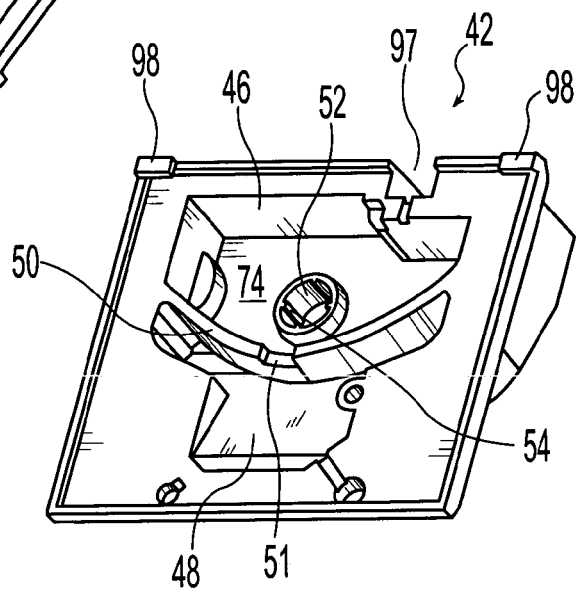
FIG. 3 is a another perspective view of the outer shielding body of FIG. 2.
Figure 4:
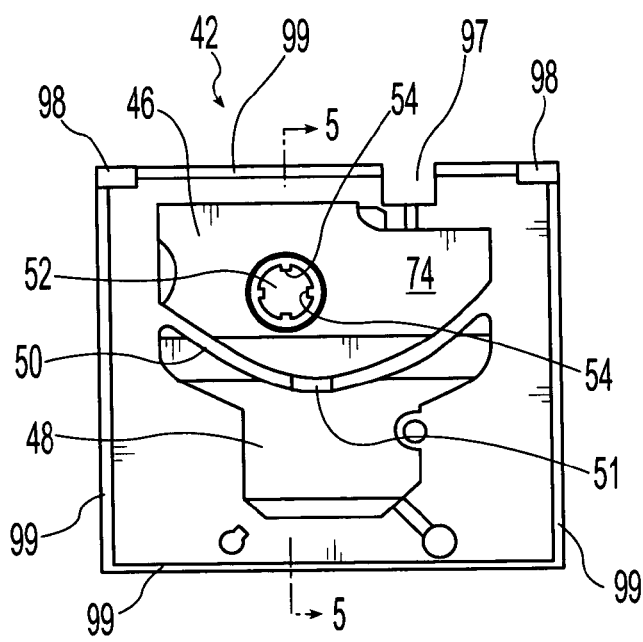
FIG. 4 is a front view of the outer shielding body of FIG. 2.
Figure 5:
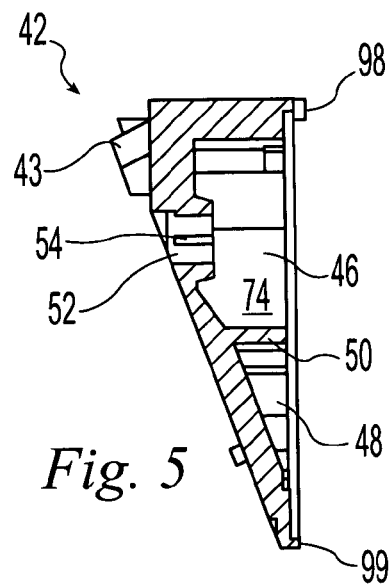
FIG. 5 is a cross sectional view taken along line 5—5 of FIG. 4.

Corresponding reference characters indicate corresponding parts throughout the several views. Although the exemplification set out herein illustrates embodiments of the invention, in several forms, the embodiments disclosed below are not intended to be exhaustive or to be construed as limiting the scope of the invention to the precise forms disclosed.

DESCRIPTION OF THE PRESENT INVENTION

In accordance with the present invention, an intrusion detection system 20 is shown in FIG. 1. The intrusion detection system includes a housing having a base 22 and removable cover 24. Cover 24 includes an infrared radiation transparent section 26 positioned over mirror 28 for reflecting infrared radiation to a sensor (not shown) on an infrared detection system on main circuit board 30. Cover 24 includes a port 32 for displaying a status light. Lights 32a–32c are used to indicate the status of system 20. System 20 further includes microwave radar module 40 secured to and in communication with main circuit board 30.

Base 22, cover 24 and infrared motion detection module 30 have a conventional design known to those having ordinary skill in the art. It is also known to provide dual technology systems which combine both microwave and infrared detection systems. For example, dual technology intrusion detection systems are described by DiPoala in U.S. Pat. Nos. 5,077,548 and 5,450,062, the disclosures of which are hereby incorporated herein by reference.

In the illustrated embodiment, microwave module 40 includes a 10.525 GHz microwave doppler transceiver. The transceiver is used to detect human motion and the RF power at the intended 10.525 GHz carrier frequency is approximately 100 mW. It is desirable to limit the RF emissions outside the intended 10.525 GHz frequency to 1 $\mu$W. In the illustrated embodiments, the second harmonic is at 21.060 GHz and it is desirable to limit the emissions outside the intended frequency to a level that is 100,000 times lower than the fundamental power.

To achieve this goal, module 40 is provided with RF shielding including an outer shielding member 42 and inner body 44. The outer housing 42 is best seen in FIGS. 2–5 and includes a conductive material to prevent the emission of RF energy through housing 42. Outer housing 42 may be a metallic part, e.g., die cast zinc. Outer housing 42 may also be formed by injection molding a polymeric material containing metallic fibers. In the illustrated embodiment, outer housing 42 is injection molded using acrylonitrile butadiene styrene ("ABS") with stainless steel fibers. More specifically, the stainless steel fibers may be added in an amount of approximately 1–2% by weight, have a length of approximately 0.050 inch (0.127 cm) and a diameter of approximately 0.0005 inch (0.013 mm). Alternative embodiments, however, may employ other conductive fibers and in other percentages. Inner body 44 of the shielding assembly is formed of a polymeric material and is best seen in FIGS. 6—10.

Outer housing 42 defines a microwave oscillator chamber 46 and a mixing chamber 48 separated by a partition 50. Outer housing 42 also includes an opening 52 in the oscillator chamber 46. Opening 52 is generally cylindrical and includes longitudinally extending projections 54. Projections 54 are adapted for engagement by the threads 58 of screw 56.

Figure 11:
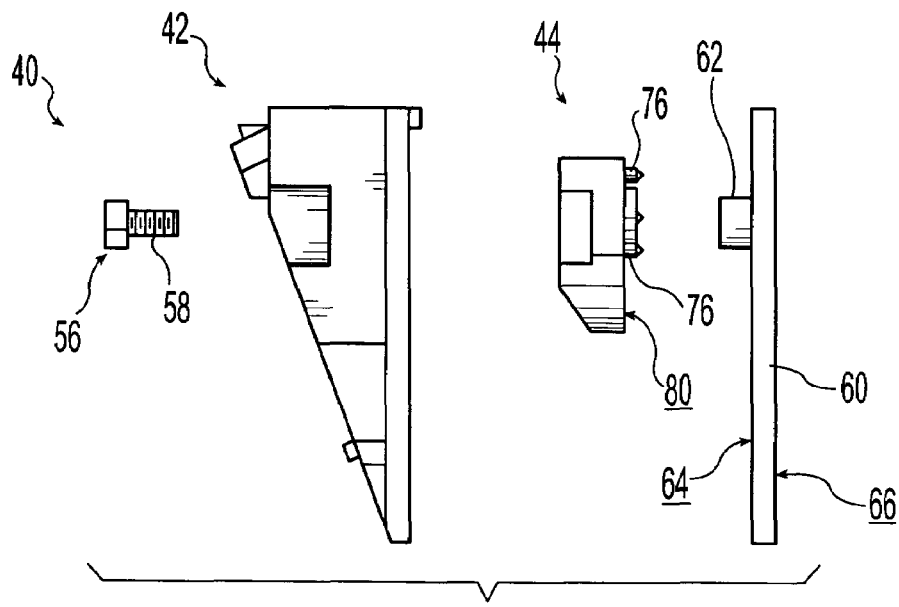
FIG. 11 is an exploded side view of the first embodiment.
Figure 12:
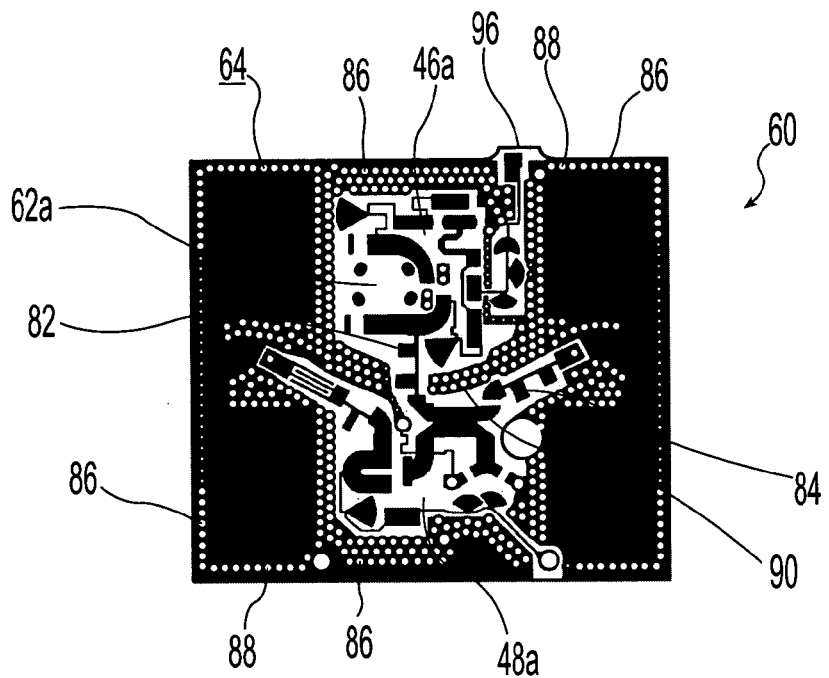
FIG. 12 is a view of the primary surface of a printed circuit board used with the first embodiment.

Module 40 also includes a printed circuit board ("PCB") 60 shown in FIGS. 11 and 12. PCB 60 defines a microwave transceiver circuit including a microwave resonant oscillator that includes a dielectric "puck" 62 that forms a projection extending outwardly from the primary surface 64 of PCB 60 as seen in FIG. 11. An example of a dielectric puck that may be used with the present invention is described in U.S. Pat. No. 5,208,567 which is hereby incorporated herein by reference. PCB 60 is mounted to outer housing 42 with primary surface 64 facing housing 42 and puck 62 projecting into oscillator chamber 46. Secondary surface 66 of PCB 60 opposite primary surface 64 forms an exterior surface of module 40. PCB 60 also includes a planar ground layer 65 formed of a conductive material, e.g., copper. The ground layer 65 is disposed parallel to primary surface 64 and secondary surface 66 and, in the illustrated embodiment, at a location between primary surface 64 and secondary surface. In alternative embodiments, ground layer 65 may form the secondary layer 64. Puck 62 is axially aligned with opening 52 whereby a metallic threaded member, i.e., screw 56, engaged with opening 52 can be readily repositioned relative to puck 62 to thereby tune the frequency of the microwave oscillator by adjusting the gap between screw 56 and puck 62. Projections 43 define bore holes for receiving threaded fasteners to mount module 40 to main circuit board 30.

Figure 10:
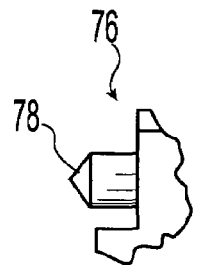
FIG. 10 is a detailed view of a portion of FIG. 9.

Prior to mounting PCB 60 to housing 42, inner body 44 is positioned within oscillating chamber 46. Inner body 44 includes an opening 68 positioned to allow puck 62 to project within one end 70 and screw 56 to project within the opposite end 72. Inner body 44 is configured to closely match the inward facing surface 74 of chamber 46 and substantially fills the volume of chamber 46. For example, inner body 44 includes a slanted portion 45 that corresponds to the slope of interior surface 74 of chamber 46. Inner body 44 includes spacing elements 76 that engage PCB 60 at predetermined locations on PCB 60 that will not be affected by their contact with inner body 44. As best seen in FIG. 10, in the illustrated embodiment, spacing elements 76 are cylindrical projections that terminate in distal conical portions 78 which engage PCB 60. The use of distal conical portions 78 keep the surface area of the contact between inner body 44 and PCB 60 to a minimum. Inner body 44 has a surface 80 that faces PCB 60 and when housing 42, inner body 44 and PCB 60 are assembled together, spacing elements 76 maintain a spacing of approximately 0.05" between inner body 44 and primary surface 64 of PCB 60 to prevent inner body 44 from degrading the performance of the microstrip circuitry defined on primary surface 64.

The illustrated embodiment is assembled by first positioning inner body 44 in chamber 46 and then securing PCB 60 to housing 42. PCB 60 may be secured to outer housing 42 in a variety of ways, such as by a snapfit engagement, adhesives, fasteners or other suitable means. PCB 60 is snapfit assembled to housing 42. PCB 60 includes a projection 96 in its outer perimeter that fits within gap 97 in housing 42 to properly locate PCB 60. As extension 96 is slid into gap 97 the corners of the edge of PCB 60 from which extension 96 projects are slid under ledges 98 on housing 42 and then PCB 60 is secured within lip 99 which projects approximately 0.034 inches (0.864 mm) and is disposed on the perimeter of housing 42.

Figure 6:
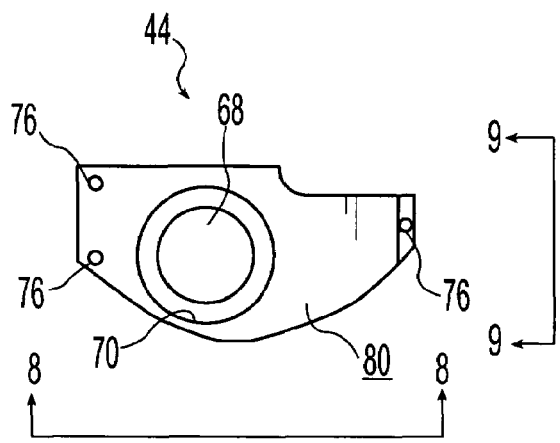
FIG. 6 is a front view of an inner shielding body in accordance with the first embodiment of the invention.
Figure 7:
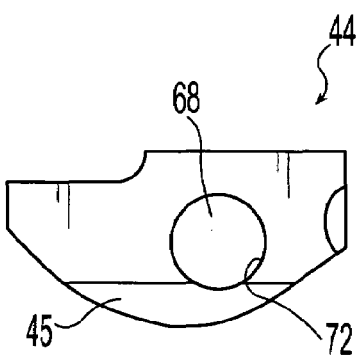
FIG. 7 is a rear view of the inner shielding body of FIG. 6.
Figure 8:
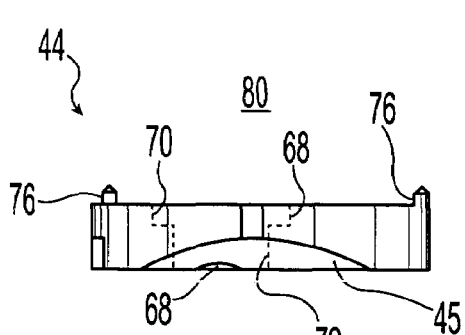
FIG. 8 is an edge view of the inner shielding body taken along line 8—8 of FIG. 6.
Figure 9:
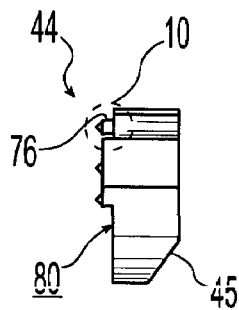
FIG. 9 is an edge view of the inner shielding body taken along line 9—9 of FIG. 6.

After securing PCB 60 to housing 42, opening 68 in inner body 44 circumscribes puck 62 and inner body 44 is compressively secured between housing 42 and PCB 60. Opening 68 has a larger diameter than puck 62 whereby the interior surface of opening 68 remains spaced from puck 62 so that inner body 44 does not interfere with the operation of puck 62. As best seen in FIGS. 6 and 8, in the illustrated embodiment, opening 68 has a larger diameter at end 70 which circumscribes puck 62 and a smaller diameter at end 72 through which screw 56 extends. The desired distance between inner body 44 and puck 62 will vary depending upon the composition of inner body 44. If inner body 44 includes a semiconductive material, a greater spacing distance will generally be desirable to avoid interference with the operation of puck 62. Similarly, an increase in the spacing distance will generally be desirable when increasing the percentage of semiconductive materials within inner body 44. The desired spacing will also be dependent upon the type of microwave oscillator that is employed. For example, bipolar transistor oscillators have more gain than comparable FET oscillators and are therefore more sensitive to nearby loading. Designs employing a bipolar transistor oscillator are thereby also more likely to benefit from the use of semiconductive materials in the inner body or the use of a higher percentage of such semiconductive materials. Empirical testing can be used to readily determine an appropriate distance and quantity of semiconductive material for individual designs.

Primary surface 64 of PCB 60 is illustrated in FIG. 12. The general design of a microwave circuit board is known to those having ordinary skill in the art. An example of a known microwave circuit board is described in U.S. Pat. No. 5,262,783 which is hereby incorporated herein by reference. Illustrated PCB 60 is adapted to function with shielding assembly 42, 44 to reduce unwanted RF emissions. In FIG. 12, reference numeral 62a indicates the location of puck 62 (not shown in FIG. 12). Similarly, reference numerals 46a and 48a respectively indicate those portions of PCB 60 that are disposed facing chambers 46 and 48. That portion 46a of the microwave circuit board facing chamber 46 generates the radio frequency signal transmitted by module 40 in a manner well known to those having ordinary skill in the art. That portion 48a of the microwave circuit board facing chamber 48 includes a mixing diode and mixes the received signal and the transmitted signal in a manner well known to those having ordinary skill in the art to ascertain the presence and movement of an object in the volume under surveillance by module 40.

PCB 60 includes a conductive material defining a signal path whereby the outgoing signal generated by the microwave oscillator passes through a multi-pole microstrip second harmonic filter 82 which is located in the signal path between the oscillator chamber 46 and mixing chamber 48. Filter 82 is disposed facing recess 51 in partition 50 when module 40 is assembled. An additional multi-pole microstrip second harmonic filter 84 is included in the signal path and filters the outgoing signal a second time immediately prior to the communication of the outgoing signal to the transmitting antenna at through hole 92. As shown in FIG. 1, secondary surface 66 of PCB 60 includes transmitting patch antennas 91 and receiving patch antennas 95. Plated through holes 92, 93 provide conductive paths between primary surface 64 and antennas 91, 95 respectively.

FIG. 12 illustrates a large number of grounding vias 86, i.e., plated through holes that provide electrical connection between a conductive trace on primary surface 64 and the ground plane 65 of PCB 60. The black areas shown in FIG. 12 (and in FIG. 13) represent traces of a conductive material on primary surface 64. As discussed in greater detail below, the ground plane of PCB 60 and outer housing 42 act as a shielding enclosure to limit unwanted RF emssions. The ground plane and outer housing 42 are spaced apart, however, by the thickness of PCB 60 between primary surface 64 and the ground plane. Grounding vias 86 are used to prevent or limit the emission of relatively small wavelength RF energy through this gap. A line of grounding vias 86 are located along the outer perimeter of PCB 60 and are spaced at less than 1/10 the wavelength of the RF emissions of concern. As can also be seen in FIG. 12, multiple rows, as indicated by reference numeral 88, of grounding vias 86 are also used to isolate chambers 46 and 48. The multiple rows of grounding vias 86 indicated by reference numeral 90 are located along partition 50 to facilitate the isolation of chambers 46 and 48. The use of multiple staggered rows of grounding vias 86, as opposed to a single line of grounding vias 86, enhances the shielding effect of the grounding vias 86, however, the shielding of module 40 may also be enhanced with alternative configurations that employ only single lines of grounding vias 86.

As described above, outer housing 42 includes a conductive material, which in the illustrated embodiment is stainless steel fibers dispersed in an ABS material. A sufficient quantity of fibers are used such that the fibers are in overlapping contact and without significant gaps. During the injection molding of outer housing 42, the stainless steel fibers will tend to migrate away from the outer boundaries of housing 42. Thus, contact between the exterior surface of housing 42 and a grounded conductor will not ground housing 42 unless the surface of housing 42 is prepared in a manner that exposes a sufficient number of the stainless steel fibers. In the illustrated embodiment, the stainless steel fibers are not exposed to provide DC grounding between housing 42 and PCB 60, instead, an AC grounding of housing 42 is achieved by the formation of a capacitor between housing 42 and ground plane 65 of PCB 60.

Although housing 42 performs well in preventing the emission of unwanted RF energy out of the enclosure defined by housing 42, housing 42 reflects, instead of absorbs, a significant quantity of the RF energy that impinges upon housing 42. The reflection of such RF energy can have undesirable effects on the performance of the system. The use of internal partition 50, grounding vias 86 at location 90 along partition 50, and filter 82 facilitate the isolation of the oscillator chamber 46 from the mixer chamber 48 and thereby limit the negative impact of such reflected RF energy. Additionally, inner body 44 is located within and substantially fills chamber 46, i.e., inner body fills at least about 50% of the void volume within chamber 46. Advantageously, inner body 44 fills at least about 80% of the void volume within chamber 46. In the illustrated embodiment, inner body 44 is an ABS material and includes approximately 4.5% carbon powder by weight. More specifically, the material used is an ABS Grade T material commercially available from G.E. Plastics Company, a subsidiary of General Electric Company with 4.5% carbon filler ±0.5%. Alternatively, Polyac, ABS Grade PA-757 commercially available from Chi Mei Corporation headquartered in Tainan County, Taiwan can be used with 4.5% carbon filler ±0.5%. While outer housing 42 tends to reflect RF energy, inner body 44 is provided to absorb RF energy and convert it to thermal energy. The greater thickness of inner body 44 facilitates the absorption of RF energy transmitted therethrough. Advantageously, inner body 44 will have a thickness, as measured between PCB 60 and outer housing 42 in a direction perpendicular to primary surface 64, of at least about 0.25 inches (0.385 cm). In comparison, the thickness of the walls of outer housing 42 are advantageously between approximately 70/1,000 inch (1.78 mm) to 1/10 inch (2.54 mm) thick. In the illustrated embodiment, inner body 44 has a thickness of 0.24 inches (0.61 cm) and a length of 1.24 inches (3.15 cm). Opening 68 has a larger diameter of 0.5 inches (1.27 cm) that is 0.120 inches (0.30 cm) deep at end 70 and a smaller diameter of 0.35 inches (0.89 cm) at end 72. Inner body 44 can be economically manufactured by injection molding using a polymeric material such as ABS or nylon. Alternative embodiments, however, may employ other manufacturing methods and polymeric materials. The performance of the inner body in absorbing RF energy can be enhanced by adding a filler material to the polymeric material such as a semiconductive material or a dispersed conductive material. The filler material may advantageously be added in an amount ranging between 2–10% by mass of the inner body, however, other percentages of filler material may also be used with the present invention. For example, semiconductive materials such as graphite, carbon fibers or powder can be added to the polymeric material. The optimum amount of graphite, carbon or other semiconductive material added to the polymeric material will differ on the configuration and dimensions of the inner body as well as the characteristics of the microwave oscillator and the desired result. A range of 2–10% by weight of carbon powder or fibers added to an ABS material can be suitable for use in shielding the resonant oscillator of an intrusion detection system employing microwave radar. Alternatively, a dispersed conductive material may be added to the polymeric material. For example, powders of metallic materials such as steel, stainless steel or lead could be added to the polymeric material. The conductive material are sufficiently dispersed to prevent the inner body from becoming a conductive body. In other words, while the individual filler particles may be conductive they are sufficiently dispersed to prevent the filler particles from forming a large unitary conductive mass within the inner body.

Figure 13:
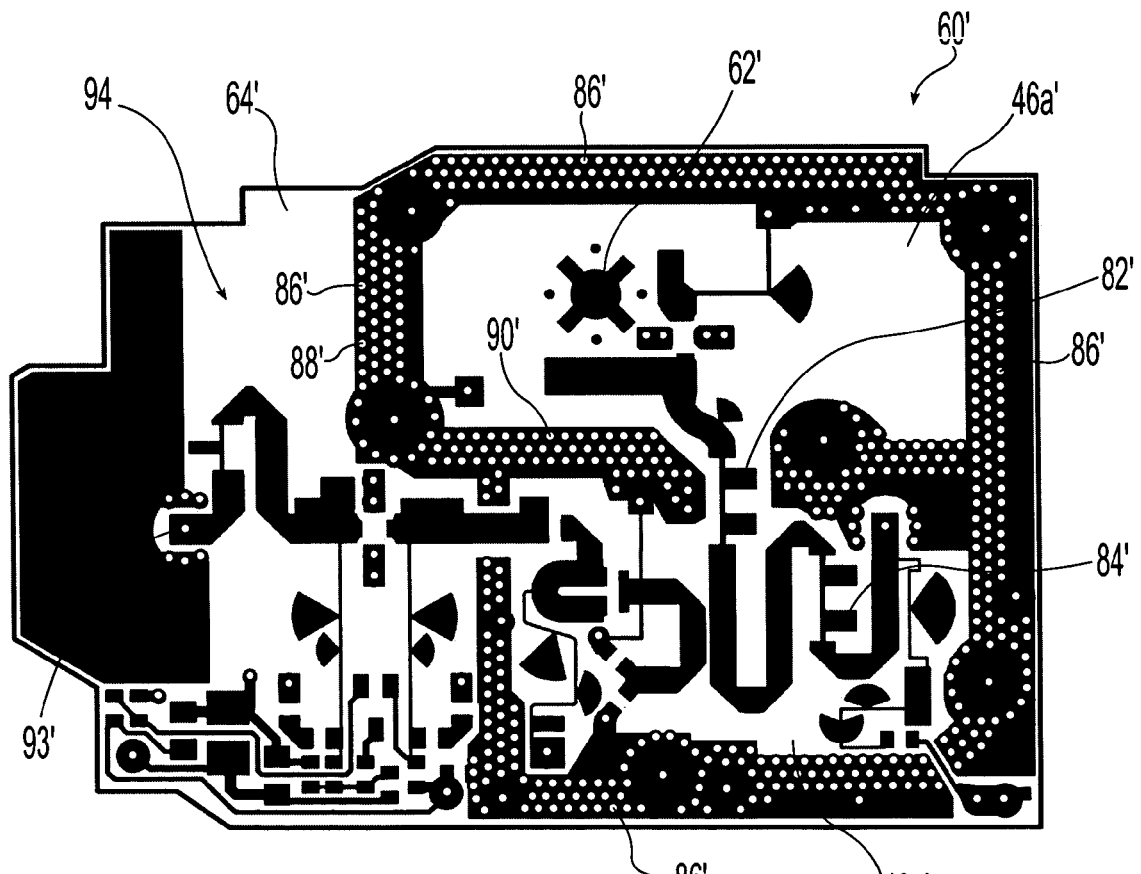
FIG. 13 is a view of the primary surface of a printed circuit board used with a second embodiment of the present invention.
Figure 18:
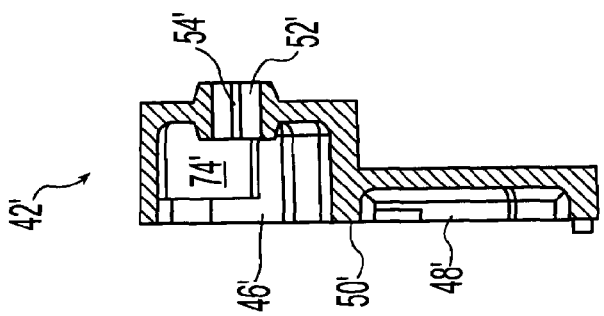
FIG. 18 is a cross sectional view taken along line 18—18 of FIG. 17.
Figure 16:
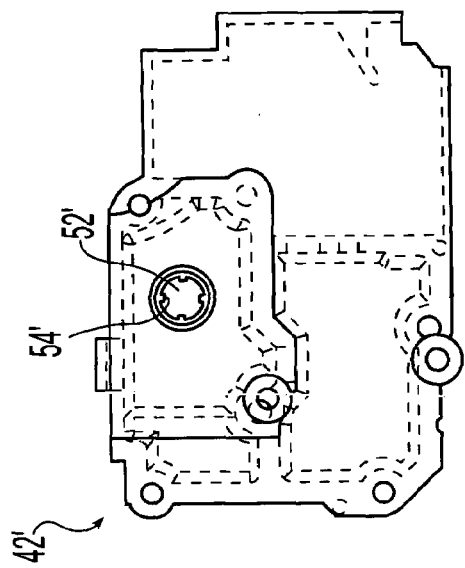
FIG. 16 is a front view of the outer shielding body of FIG. 14.
Figure 17:
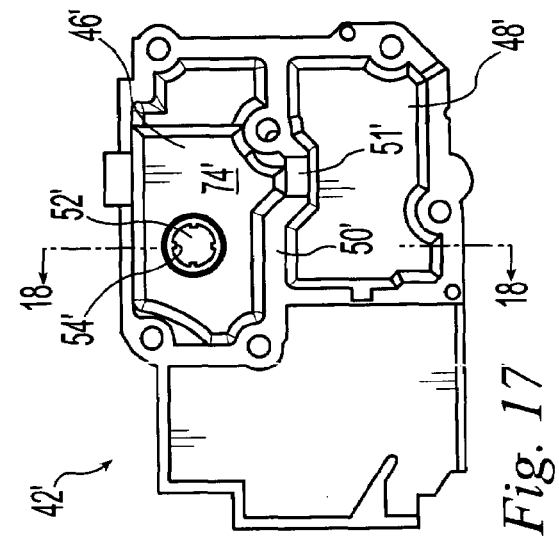
FIG. 17 is a rear view of the outer shielding body of FIG. 14.
Figure 14:
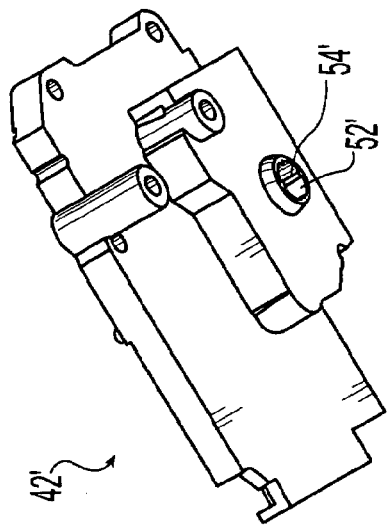
FIG. 14 is a perspective view of an outer shielding body in accordance with the second embodiment of the present invention.
Figure 15:
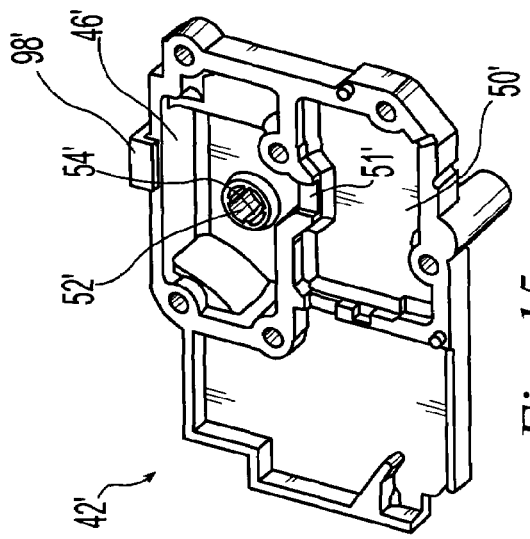
FIG. 15 is another perspective view of the outer shielding body of FIG. 14.

A second embodiment of a microwave module is illustrated in FIGS. 13–21. In this second embodiment 40' features having similar functions to those described above with reference to the first embodiment are indicated with prime reference numerals. To avoid redundancy, a discussion of each of these features will not be repeated. As seen in FIG. 13, the location 62a' at which puck 62' is mounted on PCB 60' is indicated. Additionally, grounding vias 86' help to isolate the oscillating chamber 46' from the mixing chamber 48' and define a boundary around both chambers 46, 48. Second harmonic filters 82' and 84' are located in positions analogous to filters 82, 84, i.e., at a partition separating the oscillating chamber from the mixing chamber and near the transmitting antenna. PCB 60' differs in that PCB 60' includes amplifying circuitry 94 for amplifying the signal obtained from the receiving antenna and transmitted at through hole 96. Unlike PCB 60, PCB 60' has antenna elements (not shown) that extend outwardly from its secondary surface 66' to form the transmitting and receiving antennas.

Inner body 44' differs from inner body 44 in that body 44' has a two part construction with a first portion 102 disposed within chamber 46', a second portion 104 disposed within chamber 48' and a bridge 106 connecting the two parts that extends through recess 51' in partition 50'. The primary source of RF energy is located in chamber 46' and consequently housing 42' and inner body 44' are configured to provide portion 102 with a greater thickness than portion 104 of inner body 44'. In the illustrated embodiment, portion 102 has a thickness of 0.295 inches (0.75 cm) between PCB 60' and outer housing 42' as measured perpendicular to PCB 60' while portion 104 has a thickness of 0.055 inches (0.14 cm). Inner body 44' is an ABS material that does not include a semiconductive filler. Opening 68' has a diameter of 0.318 inches (0.81 cm).

While this invention has been described as having an exemplary design, the present invention may be further modified within the spirit and scope of this disclosure. This application is therefore intended to cover any variations, uses, or adaptations of the invention using its general principles.

What is claimed is:

1. A shielding assembly for use with an electromagnetic field generating source, said assembly comprising:
    an outer housing comprising a conducting material, said outer housing defining a chamber enclosing the source, said outer housing defining a housing wall thickness;
    an inner body having a non-planar configuration substantially filling said chamber, said inner body defining a thickness greater than said housing wall thickness, said inner body formed of a composition comprising a polymeric material and a filler material, said filler material comprising one of the group consisting of a semiconductive material and a dispersed conductive material.

2. The shielding assembly of claim 1 wherein said filler material is a semiconductive material selected from the group consisting of carbon and graphite.

3. The shielding assembly of claim 2 wherein said polymeric material is one of the group consisting of ABS and nylon.

4. The shielding assembly of claim 1 wherein said inner body composition comprises ABS and approximately 2–10% by weight of carbon.

5. The shielding assembly of claim 1 wherein said outer housing comprises a polymeric material and metallic fibers.

6. The shielding assembly of claim 1 further comprising a printed circuit board wherein said chamber is defined by housing and said printed circuit board, the source being mounted on said printed circuit board.

7. The shielding assembly of claim 6 wherein said inner body has a first surface disposed substantially parallel to and facing said printed circuit board and at least one spacing element engaged with said printed circuit board to position said first surface at a predetermined distance from said printed circuit board, said first surface comprising a substantial majority of said inner body facing said printed circuit board.

8. The shielding assembly of claim 7 wherein said inner body is removably positioned in said chamber and secured therein by attachment of said printed circuit board to said outer housing.

9. The shielding assembly of claim 1 wherein said inner body is spaced from and substantially circumscribes the source.

10. The shielding assembly of claim 1 wherein said inner body composition includes approximately 2–10% by weight of said filler material.

11. The shielding assembly of claim 1 wherein said filler material is a dispersed conductive material comprising a metallic powder.

12. The shielding assembly of claim 1 wherein the inner body fills at least about 50% of the void volume within said chamber.

13. The shielding assembly of claim 1 wherein said inner body fills at least about 80% of the void volume within said chamber.

14. A shielded microwave transceiver assembly, said assembly comprising:
    a microwave transceiver circuit including a resonant oscillator coupled with a printed circuit board, said board having a first major surface and an opposite second major surface, said resonant oscillator defining an oscillator projection extending outwardly from said first major surface;
    an outer housing comprising a conducting material, said outer housing positioned in engagement with said first major surface wherein said outer housing and said first major surface define an area of contact, said area of contact circumscribing said oscillator projection and wherein said outer housing and said first major surface define a first chamber enclosing said oscillator projection; and
    an inner body, said inner body comprising a polymeric material, said inner body substantially filling said first chamber, said inner body spaced from and substantially circumscribing said oscillator projection.

15. The assembly of claim 14 wherein said inner body includes a semiconductive material within the approximate range of 2–10% by weight.

16. The assembly of claim 15 wherein said semiconductive material is one of the group consisting of carbon and graphite.

17. The assembly of claim 15 wherein said polymeric material is one of the group consisting of ABS and nylon.

18. The assembly of claim 15 wherein said inner body has a thickness between said printed circuit board and said outer housing of at least about 0.25 inches.

19. The assembly of claim 14 wherein said inner body has a first surface disposed substantially parallel to and facing said printed circuit board and at least one spacing element engaged with said printed circuit board to position said first surface at a predetermined distance from said printed circuit board, said first surface comprising a substantial majority of said inner body facing said printed circuit board.

20. The assembly of claim 19 wherein said predetermined distance is approximately 0.05 inches.

21. The assembly of claim 14 wherein said printed circuit board includes a grounding layer and a plurality of grounding vias comprising plated through holes electrically connecting traces on said first major surface to said grounding layer, said plurality of grounding vias defining a plurality of staggered rows substantially circumscribing said first chamber.

22. The assembly of claim 14 wherein said outer housing comprises a polymeric material and metallic fibers.

23. The assembly of claim 22 wherein said printed circuit board includes a ground layer, said outer housing forming a capacitor with said ground layer whereby said outer housing is grounded.

24. The assembly of claim 22 wherein said outer housing comprises ABS and stainless steel fibers.

25. The assembly of claim 14 wherein said outer housing and said printed circuit board further define a second chamber, said printed circuit board having a first portion disposed facing said first chamber and a second portion facing said second chamber, said area of contact between said outer housing and first major surface separately circumscribing each of said first and second chambers and substantially separating said first and second chambers, and wherein said printed circuit board includes a grounding layer and a plurality of grounding vias comprising plated through holes electrically connecting conductive traces on said first major surface to said grounding layer, said plurality of grounding vias substantially circumscribing each of said first and second chambers.

26. The assembly of claim 25 wherein said microwave transceiver circuit disposed within said first portion of said printed circuit board generates a radio frequency signal and said printed circuit board further includes a conductive material defining a signal path communicating said signal from said first portion to said second portion of said printed circuit board, said signal path including a first microstrip second harmonic filter disposed between said first and second portions.

27. The assembly of claim 26 wherein said signal path extends through said second portion and communicates said signal from said second portion to a transmitting antenna wherein said signal path includes a second microstrip second harmonic filter defined by said second portion of said printed circuit board.

28. The assembly of claim 14 wherein said inner body includes a dispersed conductive element.

29. The assembly of claim 14 wherein said inner body fills at least about 80% of the void volume of said first chamber.

30. A method of shielding a motion detection system having a resonant oscillator defining a projection extending from a printed circuit board, said method comprising:
engaging the printed circuit board with an outer housing wherein the outer housing and printed circuit board define a first chamber, the oscillator projection being disposed within the first chamber and the outer housing comprising a conductive material; and
positioning a polymeric inner body in the first chamber wherein the inner body substantially fills the first chamber, said inner body spaced from and substantially circumscribing the oscillator projection.

31. The method of claim 30 further comprising the step of injection molding the outer housing with ABS and stainless steel fibers.

32. The method of claim 30 further comprising the step of injecting molding the inner body with a polymeric material and approximately 2–10% by weight of carbon.

33. The method of claim 32 wherein the inner body is injection molded with ABS and approximately 5% carbon.

34. The method of claim 32 further comprising the step of injection molding the outer housing with ABS and stainless steel fibers.

35. The method of claim 30 wherein the polymeric inner body is positioned in the first chamber prior to engaging the printed circuit board with the outer housing and the method further comprises securing the inner body within the first chamber by securing the printed circuit board to the outer housing and thereby compressively engaging the inner body between the outer housing and the printed circuit board.

36. The method of claim 35 wherein the inner body includes a substantially planar first surface disposed parallel to and facing the printed circuit board, the first surface comprising a substantial majority of the inner body facing the printed circuit board, and wherein the method further includes maintaining a predetermined distance between the first surface of the inner body and the printed circuit board by positioning at least one spacing element between the first surface and the printed circuit board.

37. The method of claim 36 wherein the positioning element is integrally formed on the inner body.

38. The method of claim 30 further comprising the step of injecting molding the inner body with a polymeric material and a metallic powder.

39. The method of claim 30 wherein said inner body fills at least about 80% of the void volume of the first chamber.

* * * * *